United States Patent
Liu et al.

(10) Patent No.: US 10,074,036 B2
(45) Date of Patent: Sep. 11, 2018

(54) CRITICAL DIMENSION UNIFORMITY ENHANCEMENT TECHNIQUES AND APPARATUS

(71) Applicant: KLA-Tencor Corporation, Milpitas, CA (US)

(72) Inventors: Yanwei Liu, Danville, CA (US); Hawren Fang, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 197 days.

(21) Appl. No.: 14/884,670

(22) Filed: Oct. 15, 2015

(65) Prior Publication Data

US 2016/0110858 A1    Apr. 21, 2016

Related U.S. Application Data

(60) Provisional application No. 62/066,873, filed on Oct. 21, 2014.

(51) Int. Cl.

| | |
|---|---|
| *G06K 9/00* | (2006.01) |
| *G06K 9/62* | (2006.01) |
| *G06T 7/60* | (2017.01) |
| *G03F 1/84* | (2012.01) |
| *G06T 7/00* | (2017.01) |
| *G06T 7/41* | (2017.01) |
| *G06K 9/03* | (2006.01) |

(52) U.S. Cl.
CPC .............. *G06K 9/6218* (2013.01); *G03F 1/84* (2013.01); *G06K 9/036* (2013.01); *G06T 7/001* (2013.01); *G06T 7/41* (2017.01); *G06T 7/60* (2013.01); *G06T 2207/20056* (2013.01); *G06T 2207/30148* (2013.01)

(58) Field of Classification Search
CPC ..... G06T 7/001; G06T 7/0004; G06T 7/0002; G06T 2207/30108
USPC ....... 382/141, 170, 171, 172, 190, 209, 278, 382/282; 358/537, 538, 452, 453
See application file for complete search history.

(56) References Cited

U.S. PATENT DOCUMENTS

| | | | |
|---|---|---|---|
| 5,943,437 A * | 8/1999 | Sumie | G06T 7/001 257/E21.525 |
| 6,421,458 B2 * | 7/2002 | Michael | G06K 9/00 382/151 |

(Continued)

OTHER PUBLICATIONS

"PCT International Search Report—PCT/US2015/056073", PCT International Search Report—PCT/US2015/056073, dated Dec. 28, 2015, dated Dec. 28, 2015, 4 pages.

*Primary Examiner* — Yosef Kassa
(74) *Attorney, Agent, or Firm* — Kwan & Olynick, LLP

(57) ABSTRACT

Disclosed are methods and apparatus for inspecting a photolithographic reticle. Modeled images of a plurality of target features of the reticle are obtained based on a design database for fabricating the reticle. An inspection tool is used to obtain a plurality of actual images of the target features of the reticle. The modelled and actual images are binned into a plurality of bins based on image properties of the modelled and actual images, and at least some of the image properties are affected by one or more neighbor features of the target features on the reticle in a same manner. The modelled and actual images from at least one of the bins are analyzed to generate a feature characteristic uniformity map for the reticle.

23 Claims, 5 Drawing Sheets

(56) References Cited

U.S. PATENT DOCUMENTS

| | | | | |
|---|---|---|---|---|
| 6,477,266 B1* | 11/2002 | Asar | G01N 21/95607 | 382/144 |
| 6,587,581 B1* | 7/2003 | Matsuyama | G01N 21/8851 | 250/305 |
| 6,922,482 B1 | 7/2005 | Ben-Porath | | |
| 6,950,548 B1* | 9/2005 | Bachelder | G06T 7/001 | 250/559.34 |
| 7,116,825 B2* | 10/2006 | Lee | G06K 9/6282 | 382/156 |
| 7,418,124 B2* | 8/2008 | Peterson | G03F 1/84 | 348/131 |
| 7,630,539 B2* | 12/2009 | Ikeda | G01B 11/0608 | 382/141 |
| 7,644,387 B2* | 1/2010 | Kato | G03F 1/84 | 378/34 |
| 7,729,529 B2* | 6/2010 | Wu | G01N 21/95607 | 382/144 |
| 7,764,825 B2* | 7/2010 | Oaki | G06K 9/6212 | 382/149 |
| 7,769,225 B2* | 8/2010 | Kekare | G03F 1/84 | 356/237.4 |
| 7,787,686 B2* | 8/2010 | Oaki | G03F 1/84 | 382/141 |
| 7,800,747 B2* | 9/2010 | Iwase | G01N 21/95607 | 356/237.1 |
| 8,213,704 B2* | 7/2012 | Peterson | G03F 1/84 | 356/237.4 |
| 8,260,031 B2* | 9/2012 | Yamashita | G06T 7/001 | 382/144 |
| 8,355,044 B2* | 1/2013 | Tsuchiya | G01N 21/95607 | 348/129 |
| 8,526,705 B2* | 9/2013 | Lancaster | G06K 9/00214 | 356/237.1 |
| 2007/0288219 A1 | 12/2007 | Zafar et al. | | |
| 2013/0283216 A1 | 10/2013 | Pearman et al. | | |
| 2014/0212021 A1 | 7/2014 | Amzaleg et al. | | |
| 2014/0307947 A1 | 10/2014 | Kurada et al. | | |

* cited by examiner

CRITICAL DIMENSION UNIFORMITY ENHANCEMENT TECHNIQUES AND APPARATUS

CROSS-REFERENCE TO RELATED APPLICATIONS

This application claims priority under 35 U.S.C. § 119 of prior U.S. Provisional Application No. 62/066,873, filed 21 Oct. 2014, titled "mCDU Enhancements" by Yanwei Liu, which application is herein incorporated by reference in its entirety for all purposes.

TECHNICAL FIELD OF THE INVENTION

The invention generally relates to the field of semiconductor inspection, such as reticle inspection. More particularly the present invention relates to a method to monitor critical dimension uniformity and the like.

BACKGROUND

Generally, the industry of semiconductor manufacturing involves highly complex techniques for fabricating integrating circuits using semiconductor materials which are layered and patterned onto a substrate, such as silicon. An integrated circuit is typically fabricated from a plurality of reticles. Initially, circuit designers provide circuit pattern data or a design database, which describes a particular integrated circuit (IC) design, to a reticle production system, or reticle writer. The circuit pattern data is typically in the form of a representational layout of the physical layers of the fabricated IC device. The representational layout includes a representational layer for each physical layer of the IC device (e.g., gate oxide, polysilicon, metallization, etc.), wherein each representational layer is composed of a plurality of polygons that define a layer's patterning of the particular IC device. The reticle writer uses the circuit pattern data to write (e.g., typically, an electron beam writer or laser scanner is used to expose a reticle pattern) a plurality of reticles that will later be used to fabricate the particular IC design.

Each reticle or photomask is generally an optical element containing at least transparent and opaque regions, and sometimes semi-transparent and phase shifting regions, which together define the pattern of coplanar features in an electronic device such as an integrated circuit. Reticles are used during photolithography to define specified regions of a semiconductor wafer for etching, ion implantation, or other fabrication processes.

A reticle inspection system may inspect the reticle for defects, such as critical dimension uniformity issues, that may have occurred during the production of the reticles or after use of such reticles in photolithography. Due to the large scale of circuit integration and the decreasing size of semiconductor devices, the fabricated devices have become increasingly sensitive to defects. That is, defects which cause faults in the device are becoming smaller. Accordingly, there is a continuing need for improved inspection techniques for monitoring characteristics of the reticle.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, methods and apparatus for inspecting a photolithographic reticle are disclosed. Modeled images of a plurality of target features of the reticle are obtained based on a design database for fabricating the reticle. An inspection tool is used to obtain a plurality of actual images of the target features of the reticle. The modelled and actual images are binned into a plurality of bins based on image properties of the modelled and actual images, and at least some of the image properties of each bin are affected by one or more neighbor features of the target features on the reticle in a same manner. The modelled and actual images from at least one of the bins are analyzed to generate a feature characteristic uniformity map for the reticle.

In one aspect, the feature characteristic uniformity map for each bin is a critical dimension uniformity (CDU) map for each bin. In a further aspect, each modelled image includes a target feature having a CD value and a surrounding area, and each modelled image incorporates at least a portion of the optical properties of the inspection tool. In yet a further aspect, each bin contains modeled images that contain a near-constant CD error for the CD values of the features of such bin, and the CD error variation of each bin is less than 30% of accuracy requirement on CDU measurement. In another embodiment, each modelled and actual image may have a size that includes the corresponding feature image and an image area that is within a distance that is 10 times the point-spread-function of the inspection tool from such corresponding feature image. In yet an alternative implementation, the image properties include one or more of the following characteristics: slope, shape, size, brightness, color, texture, moment of inertia, context, proximity or adjacency to other features, transparency/opaqueness, or resulting values from performing a Fourier transform or other image analysis technique on each image. In a further aspect, the binning is accomplished by first sorting the modelled and actual images into a plurality of first bins based on one or more of the image properties that are not affected by one or more neighbor features of the target features and then sorting the modelled and actual images of each first bin into a plurality of second bins based on one or more of the image properties that are affected by one or more neighbor features of the target features.

In an alternative embodiment, the binning includes using a principal component analysis (PCA) to determine which image properties to use in the binning. In another aspect, the binning includes weighting the images properties based on their relative optical effect. In a further embodiment, the binning includes using a locality-sensitive hashing process. Alternatively, the binning includes using a partitioning or agglomeration type clustering process.

In another implementation, the method includes (i) analyzing the modelled images and the actual images from each of the bins to generate a feature characteristic uniformity map for each bin, (ii) analyzing at least a portion of the feature characteristic uniformity maps to determine whether the reticle is within specification, (iii) repairing or discarding the reticle if the reticle is determined to not be within specification, and (iv) using the reticle if it is determined to be within specification. In a further aspect, a root cause is determined based on a particular one of the feature characteristic uniformity maps being out of specification and associated with a predefined signature.

In an alternative embodiment, the invention pertains to an inspection system for inspecting a photolithographic reticle. The system includes illumination optics for generating and directing an incident beam onto the reticle and output optics for detecting actual images from the reticle in response to the incident beam. The system further includes at least one memory and at least one processor that are configured to initiate one or more of the above described operations. In other embodiments, the invention pertains to computer readable media having instructions stored thereon for performing at least some of the above described operations.

These and other aspects of the invention are described further below with reference to the figures.

DETAILED DESCRIPTION OF EXAMPLE EMBODIMENTS

Figure 1:
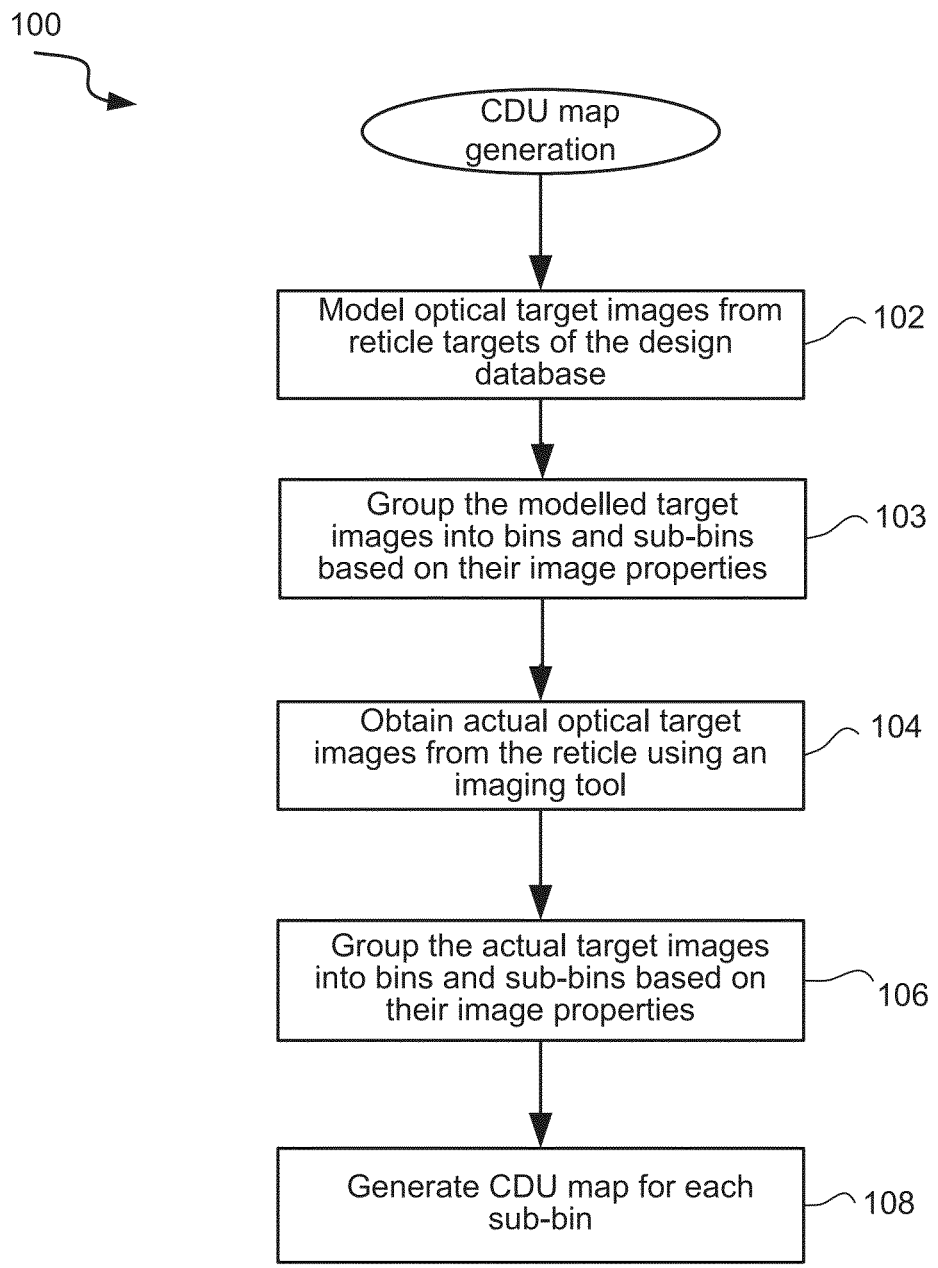
FIG. 1 is a flow chart illustrating a CDU map generation procedure in accordance with one embodiment of the present invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Certain embodiments of the present invention provide techniques and systems for inspecting a reticle to detect defects or, more specifically, variations in characteristics, such as critical dimension (CD), of reticle features. Although the following example embodiments are described with respect to a reticle, any suitable type of sample (e.g., wafer) may be monitored using such techniques or systems. Additionally, the following example embodiments can be applied to the monitoring of other sample characteristics, besides CD variation, such as height uniformity, sidewall angle uniformity, surface roughness uniformity pellicle transmissivity uniformity Quartz transmissivity uniformity, etc.

The terms "reticle" generally includes a transparent substrate, such as glass, borosilicate glass, quartz, or fused silica having a layer of opaque material formed thereon. The opaque (or substantially opaque) material may include any suitable material that completely or partially blocks photolithographic light (e.g., deep UV). Example materials include chrome, molybdenum silicide (MoSi), tantalum silicide, tungsten silicide, opaque MoSi on glass (OMOG), etc. A polysilicon film may also be added between the opaque layer and transparent substrate to improve adhesion. A low reflective film, such as molybdenum oxide ($MoO_2$), tungsten oxide ($WO_2$), titanium oxide ($TiO_2$), or chromium oxide ($CrO_2$) may be formed over the opaque material.

The term reticle refers to different types of reticles including, but not limited to, a clear-field reticle, a dark-field reticle, a binary reticle, a phase-shift mask (PSM), an alternating PSM, an attenuated or halftone PSM, a ternary attenuated PSM, and a chromeless phase lithography PSM. A clear-field reticle has field or background areas that are transparent, and a dark-field reticle has field or background areas that are opaque. A binary reticle is a reticle having patterned areas that are either transparent or opaque. For example, a photomask made from a transparent fused silica blank with a pattern defined by a chrome metal adsorbing film can be used. Binary reticles are different from phase-shift masks (PSM), one type of which may include films that only partially transmit light, and these reticles may be commonly referred to as halftone or embedded phase-shift masks (EPSMs). If a phase-shifting material is placed on alternating clear spaces of a reticle, the reticle is referred to as an alternating PSM, an ALT PSM, or a Levenson PSM. One type of phase-shifting material that is applied to arbitrary layout patterns is referred to as an attenuated or halftone PSM, which may be fabricated by replacing the opaque material with a partially transmissive or "halftone" film. A ternary attenuated PSM is an attenuated PSM that includes completely opaque features as well.

In general, the opaque, absorbing, partially opaque, phase-shifting material is formed into pattern structures that are designed and formed with critical dimension (CD) widths, which also results in clear spaces between the structures that also have a CD. A particular CD value may generally affect how a particular reticle feature is transferred to the wafer in the photolithography process, and such CD is chosen to optimize this transfer process. Said in another way, if a certain reticle feature's CD value is within a specified CD range, such CD value will result in fabrication of a corresponding wafer feature that allows proper operation of the resulting integrated circuit, as intended by the circuit designer. Features are typically formed with minimum dimensions that also result in operational circuits so as to conserve integrated chip area.

A newly fabricated reticle may include CD (or other film or pattern characteristic) defect issues. For example, the reticle may have defective CD regions, such as mask-writer swath-errors. A reticle may also become damaged over time in a number of different ways. In a first degradation example, the photolithographic exposure process may result in physical degradation of the opaque material of the reticle. For instance, a high power beam, such as a high powered deep ultra violet (UV) beam at 193 nm, that is used on the reticle may physically cause damage to the opaque material on the reticle. Damage may also be caused by other wavelengths, such as a 248 nm UV beam. In effect, the UV beam can physically cause the opaque patterns on the reticle to slump and causing the features to flatten. As a result, opaque features may have significantly larger CD widths, as compared to original CD widths, while the spacing between such opaque features may have a much smaller CD width, as compared with the original CD width. Other types of CD degradation may be caused by chemical reactions between the reticle features (MoSi) and the exposure light, cleaning processes, contamination, etc. These physical effects can also adversely affect the critical dimensions (CD's) of the reticle over time.

As a result of this degradation, the feature CD values may have significantly changed so as to affect CD uniformity across the reticle and adversely affect wafer yield. For instance, mask feature widths in portions of the mask may be significantly larger than the original line width CD. For instance, there may be a radial pattern of CD non-uniformity, with the center of the reticle having different CD than the edges of the reticle.

Certain previous CDU techniques, such as mCDU available on the Rapid System from KLA-Tencor Corp. of Milpitas, Calif., work by finding quasi-1D features (e.g., lines) in a mask design database and grouping these features into different bins based on line type. For example, opaque lines may be grouped separately from semi-transparent lines. Within each bin, the width of the captured optical image from each line is measured and then compared to each other to obtain the CD uniformity information.

This mCDU approach does not take into account the optical proximity effect in captured images. Identical patterns on the mask do not necessarily produce exactly the same optical images since the optical images are affected by their neighboring features. For instance, optical proximity correction marks are designed to alter the pattern that is printed on the wafer, as well as causing an alteration in the corresponding optical images. Additionally, closely packed patterns may affect each other's optical image. In certain cases, the mCDU may not handle the complexity of advanced logic plates and, as a result, a significant part of the mCDU results may actually come from artifacts caused by optical proximity effect, while true mask CDU signatures are hidden in certain observable artifacts. In sum, the optical proximity effect may result in inaccurate measurements of CD for particular lines, in which even small inaccuracies, e.g., a few nm or less, are coming from the neighboring features, resulting in unacceptable levels for CD measurement accuracy.

In theory, if the modeling of mask patterns is accurate, a direct comparison of (captured) optical image and (modeled) reference image may be performed to obtain the CDU information. However, in a fast inspection system, imaging models are generally simplified to allow real-time computation. These stream-lined imaging models are sufficient for conventional defect detection, where the defect size is in the order of 10 nm or bigger. However, such simplified models may not be accurate enough to support CDU measurement in cases in which defects are less than about 0.5 nm, which may be routinely found in current designs.

In certain techniques of the present invention, a hybrid approach in which the modeled image is used to capture optical proximity effects in a limited, yet real-time, manner may be used. In one example, an optical model may first be used to generate modelled images that have different image properties for imaged features that are surrounded by different neighbors on the reticle that have different optical effects on such imaged features. Even though the model can account for whether features have different neighbors, the actual CD value is unknown since there will still be proximity effects embedded in a CD measurement. However, targets that have similar neighbors will tend to result in similar image properties. Targets having similar imaging characteristics will be binned and then sub-binned, and each sub-bin of images will be handled together as further described below. The target images in each sub-bin will all have the same inaccuracies caused by neighbor features. Thus, the CDU differences within a same sub-bin can be attributed to the CDU differences, rather than the proximity effect, which are cancelled out.

FIG. 1 is a flow chart illustrating a CDU map generation procedure 100 in accordance with one embodiment of the present invention. Initially, optical target images may be modeled from reticles targets of the design database in operation 102. The design database would typically be available in a die-to-database defect inspection, for example, which is performed immediately after the reticle is fabricated. Although the design database and/or the modeled images are preferable retained by the reticle manufacturer, the design database may also be made available for inspection in the wafer fabrication facility, e.g., for inspecting the reticle after use of the reticle to fabricate devices.

Any suitable model may be used to generate optical images for the line features of the design database. A modelled image clip of each line feature and its surrounding neighbors or background is generated. In general, the model simulates the optical properties of a particular imaging tool that will be used on the actual reticle to obtain reticle images. The imaging tool generally is configured to obtain electromagnetic wave signals from a reticle or other specimen type in response to incident electromagnetic waves that are directed towards the particular specimen.

The model is preferably simplified so as to allow real-time CDU measurements as optical images are retrieved from a reticle. For instance, modeled images are generated as quickly as images of the reticle are obtained by the inspection tool. In other words, the model does not necessarily generate accurate CD for each sub-bin, but any errors in CD are near-constant for each sub-bin. In general, the model is selected so as to not be too complex, but also to result in errors in each bin that are constant or the errors' variations are small compared to the CDU measurement accuracy requirement. For example, the model error variation of each bin is less than 30% of the CDU measurement accuracy requirement. In a sense, the model is selected to be as simple as possible and still result in accurate CDU measurements for each sub-bin while tolerating errors due to proximity effects. Example models include the database rendering model used in KLA-Tencor's reticle inspection systems, etc.

Each modelled image clip is preferably generated based on a particular target structure and its surrounding neighbors within a particular distance from such particular target. The size of the clip depends on the target and the distance away from such target within which any neighbor structures may possibly or likely have an optical effect on the resulting modeled target image. For example, the image clip may be sized to include the feature and any neighbor features or an area that is within a distance that is 10 times the point-spread-function of the imaging system from the feature. The model will include at least some of the optical effects that would be present in the inspection tool or whatever imaging optical tool that is being modeled. If the optics modelling is substantially similar to the photolithography tool, then the modeled image will be similar to the wafer pattern that can be printed onto a semiconductor wafer using such reticle target pattern. If the resolution of the modeled optics is high as in a high resolution imaging tool, however, OPC structures may be generated in the modeled image.

The modelled target images (or clips) may be grouped into bins and sub-bins based on their image properties in operation 103. Any suitable image properties may be used to bin the modelled target images. Example image properties may include the feature slope, shape, size, brightness, color, texture, moment of inertia, context, proximity or adjacency to other features, transparency/opaqueness, resulting values from performing a Fourier transform or other image analysis technique on each image, etc. One or more transformations may be used and may include, but are not limited to, DFT (discrete Fourier transform), DCT (discrete cosine transform), Wavelet transform, etc. For example, the image clips may first be grouped into bins based on line type or other image properties that do not necessarily pertain to optical effects caused by neighbor features, and then each bin can be grouped by other features that relate to optical effects caused by neighbor features, such as feature shape, into sub-bins. Image properties that pertain to different neighbor features that cause optical effects are incorporated into the sub-binning process so that target structures that have different neighbors are sub-binned into different sub-bins.

In a specific example, each sub-bin will then contain features with the same shape if shape is used to bin the target images. In another example, images in each bin may be sub-binned based on the coefficients of Fourier transformation of each image so that each sub-bin contains images that result in the same Fourier transform coefficients (e.g., number of peaks, location of peaks, amplitude values, etc.). Image clips that contain both a target and neighboring structures and background may also or alternatively be sub-binned based on an amount of target's slope. Particular neighbor structures may cause the slope or tilt of a target to change in a particular manner.

In one specific embodiment, a clustering process is used to group the image clips into bins or sub-bins. For instance, each two-dimensional clip is transformed into a one-dimensional feature vector, containing various image values as described above, such as slope value, etc. The feature vectors are then analyzed for similarity using any suitable clustering algorithm, such as a partitioning or merging type process, e.g., K-means clustering, spectral clustering, mean-shift clustering, Gaussian mixture model (GMM), etc.

Example automated feature extract techniques include Principal Component Analysis (PCA), Independent Component Analysis (ICA), Local Linear Embedding (LLE) algorithm, etc. Any number of principal components may be selected based on the particular requirements of the application. For instance, the first 30~40 principal components, as determined via PCA, may be used. In a preferred embodiment, 10 to 20 principal components are utilized. In yet another example, the output from another feature extraction tool, such as kernel PCA, ICA or LLE, may be used.

In a PCA embodiment, the extracted feature corresponds to a transformation of the measured dataset onto a different coordinate system and selection of a particular dimension (or direction or projection direction) of such new coordinate system along which the transformed dataset has the most variation, which provides the most information with respect to changes. The first principal component corresponds to a transformed direction or dimension of the PCA-transformed dataset that is found to have the most variation. The second principal component has the second most variation, etc.

Figure 2A:
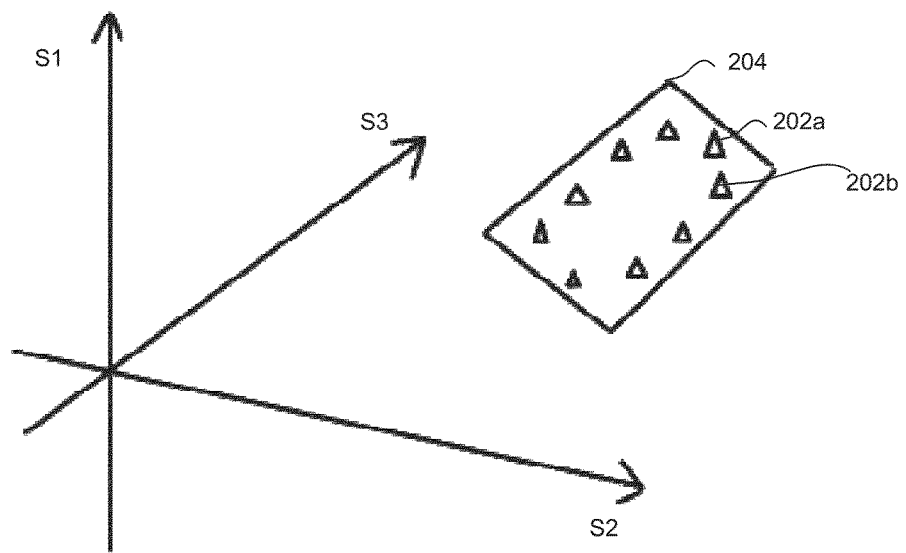
FIG. 2A is a plot of a signal dataset as a function of three basis attributes in accordance with one embodiment of the present invention.

FIG. 2A is a plot of a signal dataset as a function of three basis attributes in accordance with one embodiment of the present invention. As shown, the sample dataset has three dimensions corresponding to different attributes, and the dataset is plotted relative to these different attributes. For instance, S1 corresponds to a first attribute; S2 corresponds to a second attribute, and S3 corresponds to a third attribute.

The dataset includes data points (e.g., 202a and 202b) that correspond to image properties with respect to the different attributes. In the illustrated example, attribute S1 is associated with a constant value for all the data points. That is, the data sets reside in a plane that is perpendicular to the S1 dimension. In one application, S1 may represent an attribute that does not result in any measured image property variation for different images.

Figure 2B:
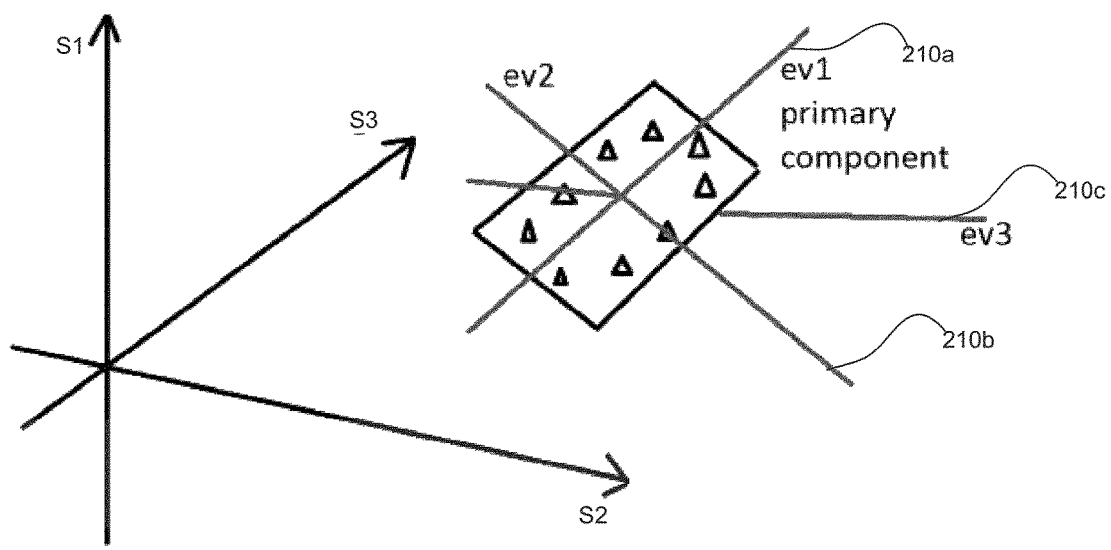
FIG. 2B illustrates the three eigenvectors for the three dimensional dataset of FIG. 3A in accordance with a specific implementation of the present invention.

FIG. 2B illustrates the three eigenvectors for the three dimensional dataset of FIG. 2A in accordance with a specific implementation of the present invention. As shown, the dataset has three eigenvectors ev1 (210a), e2 (210b), and e3 (210c). Each of the eigenvectors also has an eigenvalue that corresponds to the amount of variance in the dataset with respect to such eigenvector. For instance, the principal eigenvector e1 (210a) is associated with the most dataset variance. In contrast, the eigenvector e2 (210b) has significantly less dataset variance, and the eigenvector e3 (210c) has zero dataset variance. The top most eigenvalues that correspond to the highest dataset variance can be selected and used to determine the basis components and coefficients. Eigenvalues determine the strength of corresponding eigenvectors. The relative eigenvalue strengths may be used to determine the weights of the attributes (or image properties) to use for binning or sub-binning.

Any similar image attributes may also be optionally grouped together using any suitable similarity metric, such as a Jaccard similarity coefficient. That is, the attribute data set can be pre-processed to measure the similarity between attributes and similar attributes can be grouped together based on the level of similarity. This pre-processing reduces the dimensionality of the data set used in the user clustering. The Jaccard coefficient measures similarity between finite sample sets and is defined as the size of the intersection divided by the size of the union of the sample sets A and B:

$$J(A, B) = \frac{|A \cap B|}{|A \cup B|}$$

For example, if when analyzing the dataset it was found that distance of a nearest neighbor structure was so strongly correlated with the size of a nearest neighbor for affecting the target image in a similar manner, then these two attributes could be combined into a new single joint attribute.

In one technique, each image's attributes are scaled and mapped to a multi-byte integer. First, the attribute categories of each attribute type can be assigned scaled numerical values. For instance, a neighbor presence attribute has two possible values, present or absent, which can be assigned a 1 or 0 value, respectively. In another example, a grayscale category may have different bins for different gray scale ranges (or intensity averages) of the target image or image clip, which can be assigned values from 0 to 1. In a simplified example, a darkest image may be assigned a value of 0; the next darkest range assigned a value of 0.25; the middle range assigned a value of 0.5; the second highest range assigned a value of 0.75; and the highest range is assigned a value of 1.

After the attribute values for each data set are assigned values, these values may then be weighted. For example, a first attribute may be correlated with an optical effect that is 10× the correlation for a second attribute. The first attribute could be weighted by 10, while the second attribute is weighted by 1. Alternatively, weights can be applied to distance calculations for the attributes of different images.

Each data set can then be transformed into a unique multi-byte integer values. One technique for mapping attributes to multi-byte integer values is the locality-sensitive hashing (LSH) technique, which can facilitate finding images that have similar or shared attributes. A second clustering process may then be performed to merge the images into sub-bins by maximizing a cluster evaluation metric. In general, an unsupervised machine learning algorithm can be used to find and merge clusters having similar attribute data. In alternative embodiments, a partitioning type clustering algorithm may be used to partition each bin into a final set of sub-bins. Clustering examples may include any suitable partition or agglomerative based models.

In an agglomeration clustering approach, a proximity matrix the images in each bin may be determined. The proximity matrix generally specifies a distance between the attribute sets of each pair of images. In one embodiment, the attribute data sets for each image may be transformed into weighted integer or bit values as described above. The transformed and weighted attribute data sets for each image can then be hashed as described above before determining distances between initial groups. The hash values for each image can be used to determine a distance between the corresponding data points of pairs of images. For instance, the data points of two images that vary by a single bit in their byte values have a hamming distance (h) of 1 since their signatures vary by only a single bit. Based on a hamming distance h and a signature bit length b, cosine similarity can also be determined based on these hash values by:

$$\cos\left(\frac{h}{b}\pi\right) \text{ or } \cos\left(\frac{1}{6}\pi\right)$$

The closest two images can be merged into a new or existing sub-bin. For example, the two images that have the most similarity may be merged together into a new sub-bin. The proximity matrix may then be updated. As different images and corresponding attribute data sets are assigned to new sub-bins, the proximity matrix may be based on any suitable distance measurement between such images. For example, distance between two sub-bins may be defined as the distance between two closest attribute sets of the two sub-bins (single link), the farthest two attribute sets of the two sub-bins (complete link), average distance between sub-bin data sets, distance between average or most representative attribute data set (e.g., centroid or medoid), etc.

After a new cluster is formed by merging two clusters, it may be determined whether to stop the clustering process. If the clustering is not to be stopped, two other next closest clusters may be merged into a new or existing cluster and the proximity matrix updated. Otherwise, the clustering process stops.

A cluster process may be stopped based on any suitable factor for determining the "goodness" of the clustering results. In a specific example, a "goodness" clustering evaluation metric may be determined from a "golden standard" set of images for which it is known which images have a same optical effect. The golden standard set of images, as well as other images, can be included in the clustering process, and the clustering process can be terminated when it is determined that the golden set has been clustered to a particular level of correctness. One measure of correctness is the RAND index.

Even though the target images from each sub-bin may end up containing errors due to proximity effects, the images in the same sub-bin will all generally be wrong by the same amount. For instance, each sub-bin will contain images that have similar neighbors, resulting in similar image characteristics. Each sub-bin will tend to result in a highly accurate CDU map for the reticle. That is, the constant error bias for each sub-bin will result in correct CDU measurements for such sub-bin.

Referring back to FIG. 1, actual optical target images may be obtained from the reticle using an imaging tool in operation 104. The reticle was fabricated based on the design databased from which the modelled target images are obtained. The actual images may be obtained using any tool, such as Teron630 available from KLA-Tencor Corp. of Milpitas, Calif. The actual target images may then be grouped into bins and sub-bins based on their image properties in operation 106. The grouping for the modelled and actual target images will use the same image properties to bin and sub-bin such images.

A CDU map may then be generated for each sub-bin in operation 108. For example, the CD can be measured for each target by analyzing and measuring the distance between the target edges if the resolution is high enough. Alternatively, the intensity differences between reference and actual images may be calibrated and transformed to CD variations as described further in U.S. patent application Ser. No. 14/664,565 filed 20 Mar. 2015 by Carl E. Hess et al. and U.S. patent application Ser. No. 14/390,834 filed 6 Oct. 2014 by Rui-fang Shi et al., which applications are incorporated herein by reference in their entirety for all purposes.

One or more of the CDU maps may be analyzed to determine whether the reticle is within specifications as further described herein. One map may be enough in certain circumstances, while multiple maps may be analyzed in certain other circumstances. Some maps will contain enough target images to analyze across the entire reticle or across each die. Different maps may be more important for different types of features, such as isolated vs. non-isolated features. In general, different feature types will tend to result in different CDU maps for the reticle, which differences may be important for analyzing root cause of CDU variations. That is, the different CDU maps together provide more information for all the different types of reticle features, as compared with each single CDU map.

Embodiments of a CDU map can take any suitable form. For example, a CDU map can be represented textually as a list of average CD variation values for each area of the reticle. Each average CD variation value may be listed alongside corresponding reticle area coordinates. A CDU map can also be represented by a metric such as the standard deviation or variance of the grid point difference values. Alternatively or additionally, a CDU map may be represented visually so that different CD variation values or ranges are shown as different visual ways, such as differently colored reticle areas, different bar graph heights, different graph values, or 3-dimensional representations, etc. A CDU map can be represented with different grid point sampling sizes or by fits to different functional forms such as a polynomial fit or a Fourier transform.

These CDU maps may be important for a semiconductor chip maker to understand the process window that will result from the use of the reticle. A CDU map may allow a chip maker to determine whether to use the reticle, apply compensation for the errors in the lithography process, or improve fabrication of a reticle so as to form an improved next reticle. A CDU map may be generated and analyzed for a newly fabricated reticle so as to detect fabrication defective areas or performed on a reticle that has been used one or more times in a photolithography process so as to monitor features changes and/or detect degradation.

Figure 3:
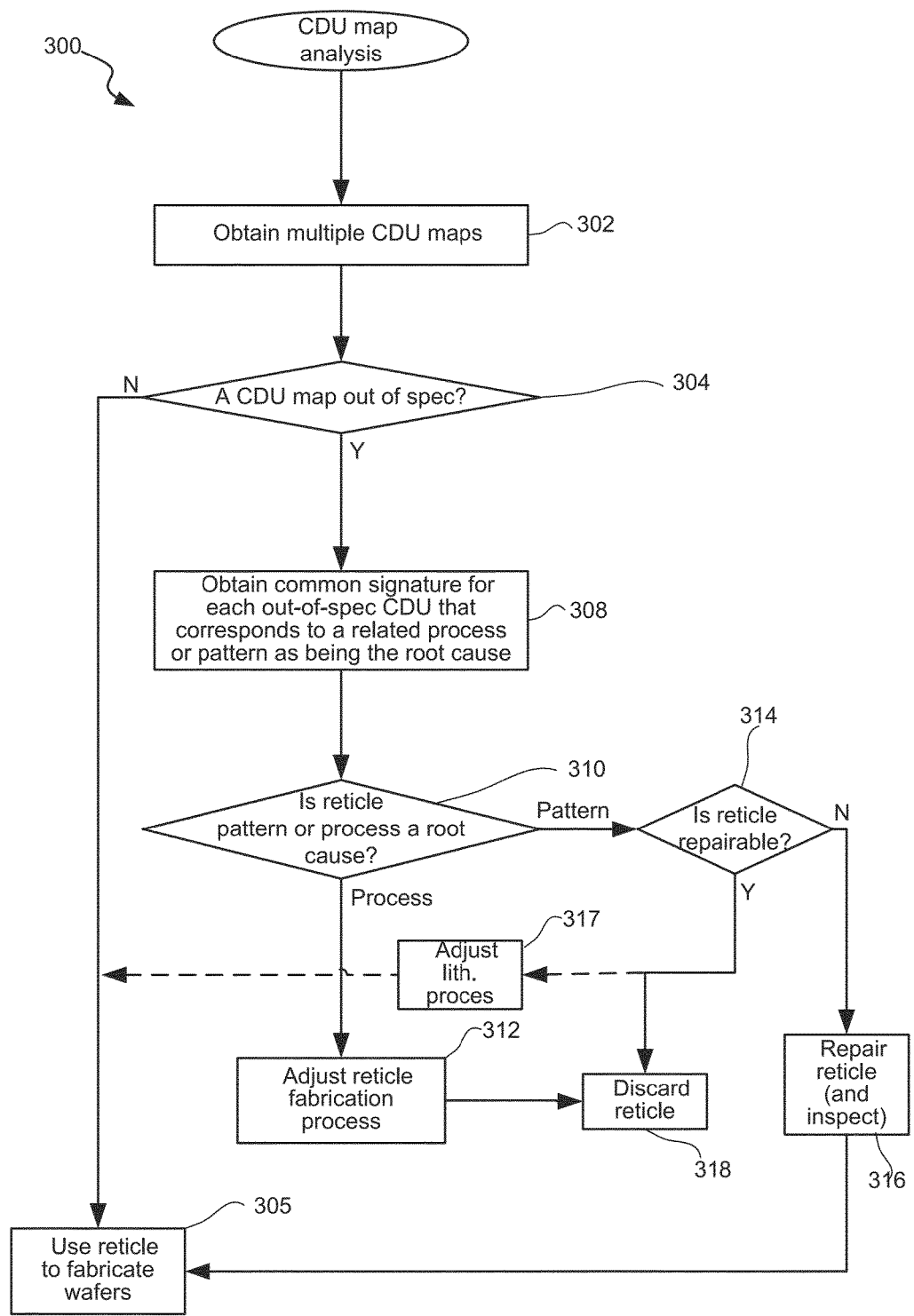
FIG. 3 is a flow chart illustrating a CDU map analysis procedure in accordance with one embodiment of the present invention.

FIG. 3 is a flow chart illustrating a CDU map analysis procedure 300 in accordance with one embodiment of the present invention. Initially, multiple CDU maps for different sub-bins may be obtained in operation 302. For instance, CDU maps are obtained for sub-bins with substantially similar image properties as described further above with respect to FIG. 1.

It may then be determined whether any of the CDU maps are out of specification in operation 304. For instance, it may be determined whether any the CDU variation for a particular reticle area is above a predefined threshold. If the CDU variation is not above the predefined threshold, the reticle may then be used to fabricate wafers in operation 305.

If the CDU variation is above the predefined threshold, a common signature for each out-of-specification CDU map that corresponds to a related process or pattern as a root cause may be obtained in operation 308. A CDU map may be used to track problem areas on the reticles, for example, that are caused by reticle fabrication/process issues or degradation of a reticle over time, such as chrome, MoSi, pellicle, cleaning type degradations. In other words, a particular out-of-specification CDU map may have a certain signature that was previously associated with a particular root cause. For instance, previous inspections and analysis of the reticle or reticle process may have uncovered root cause problems and associated CDU signatures.

Referring back to the illustrated example, it may then be determined whether the reticle pattern or process is a root cause in operation 310. For instance, it may be determined whether the CDU map has a signature that has been associated with a particular root cause, such as a dirty pellicle. If the reticle pattern is a root cause, it may then be determined whether the reticle is repairable in operation 314. If the reticle is not repairable, it may be discarded in operation 318 (and a new reticle fabricated). Otherwise, the reticle is repaired in operation 316. For instance, certain defects can be cleaned from the reticle. By way of examples, the pellicle may be cleaned or replaced or extra reticle portions may be etched or removed. After repair, a new inspection may be performed on the repaired reticle and the procedures for generating and analyzing a CDU map may be repeated. If the repaired reticle is within specification, the repaired reticle may then be used to fabricate wafers in operation 305. In alternative example, the lithography process may be adjusted to compensate for the out-of-specification reticle, e.g., by modifying dose or focus, in operation 317 and the new processed used with the reticle in operation 305. If the process for fabricating the reticle is a root cause, on the other hand, the reticle fabrication process may be adjusted in operation 312 (and the reticle is discarded and a new reticle is fabricated).

During inspection, a plurality of patch images of the patches of the reticle may be obtained using an optical inspection tool. During image acquisition, multiple patch images are obtained for each die. In the above example, a die-to-database process is used. In another example die-to-die inspection approach, the image patches are obtained or defined so as to result in die-equivalent patches between the dies, and the die-equivalent patches are processed to detect CD defects or CD variation.

Images may be obtained from patch areas of each die of a set of dies of a reticle. Said in another way, an inspection tool may be operable to detect and collect reflected or transmitted light or both reflected and transmitted light as an incident optical beam scans across each patch of each die of the reticle. An incident optical beam may scan across reticle swaths that each comprises a plurality of patches. Light is collected in response to this incident beam from a plurality of points or subareas of each patch.

The inspection tool may be generally operable to convert such detected light into detected signals corresponding to intensity values. The detected signals may take the form of an electromagnetic waveform having amplitude values that correspond to different intensity values at different locations of the reticle. The detected signals may also take the form of a simple list of intensity values and associated reticle point coordinates. The detected signals may also take the form of an image having different intensity values corresponding to different positions or scan points on the reticle. A reticle image may be generated after all the positions of the reticle are scanned and light is detected, or potions of a reticle image may be generated as each reticle portion is scanned.

Each set of intensity data may correspond to a "swath" of the reticle. Each set of intensity data may be obtained by sequentially scanning swaths from the reticle in a serpentine or raster pattern. For example, a first swath of the reticle portion is scanned by an optical beam of an optical inspection system from left to right in a positive x direction, for example, to obtain a first set of intensity data. The reticle is then moved with respect to the beam in a y direction. A second swath is then scanned from right to left in a negative x direction to obtain a second set of intensity data. Swaths are sequentially scanned from the bottom row of dies through the top row of dies or visa versa.

The patches tend to be overlapping to allow for eroding of the size of the effective patch image during further processing steps, for example, such as die alignment. Intensity data may be collected for multiple points in each patch of each swath. If the scan of a swath is aligned to sweep across the same y portion with respect to the die row, each scanned swath contains die-equivalent patches from multiple dies if such dies are identical. That is, each die's patches are positioned relative to a same reference position as each of the other die's patches for which the swath is obtained. However, the scanned swaths of a second row of dies may not have equivalent patches with the respect to the first row of dies. In one implementation, die-equivalent patches of only a single swath may be processed together, or certain portions of the swaths and patches of the different die rows may be selected for processing so as to achieve die-equivalent patches for dies that are in different rows.

In a second implementation, image swaths are obtained for the different rows of dies so that the swaths for each die row are positioned in a similar manner with respect to the dies. Regardless of how the different die rows are scanned, an alignment process may be used to achieve true die-equivalent patches between test and reference die patches. After images are obtained for all the dies (or optionally only two or more dies), each die image may be aligned with respect to another die image prior to performing an inspection process. For instance, each test die image can be aligned with a corresponding reference die image.

An integrated value for an image characteristic, such as an integrated intensity value, may be determined for each patch (or multiple patches). In certain implementations, an average or median reflected and/or transmitted intensity value may be determined for each patch or set of two or more patches. The intensity values corresponding to the reflected light may also be combined with the intensity values for the transmitted light before or after determining the average reflected and transmitted intensity value for each patch. For instance, an average of the reflected and transmitted intensity values may be determined for the points or pixels of each patch. Alternatively, the averages may be calculated separately for the reflected and transmitted intensity values of a patch. The separately calculated reflected average and transmitted average for each patch may also be combined or averaged together.

In an alternative embodiment, the integrated intensity value for each patch may be generated based on reflected light, transmitted light, or both as detected during reticle inspections. In one example implementation, the reflected (R) and transmitted (T) values may be combined by (T−R)/2. The reflected signal typically is the opposite sign from the transmitted signal. Hence, subtracting the T and R signals adds the signals together. Since the noise sources are different for T and R, the noise can tend to be averaged out of the combined signal. Other weightings to R and/or T values may be used to generate integrated intensity values for a patch with associated benefits. In some cases, R and T signals for particular regions may have a same sign, instead of an opposite sign, which may indicate that the results are inconsistent in the associated regions and may not be trustworthy. Thus, the combination of R and T could be down-weighted in such regions or removed from the computation if insufficiently trustworthy.

Figure 4:
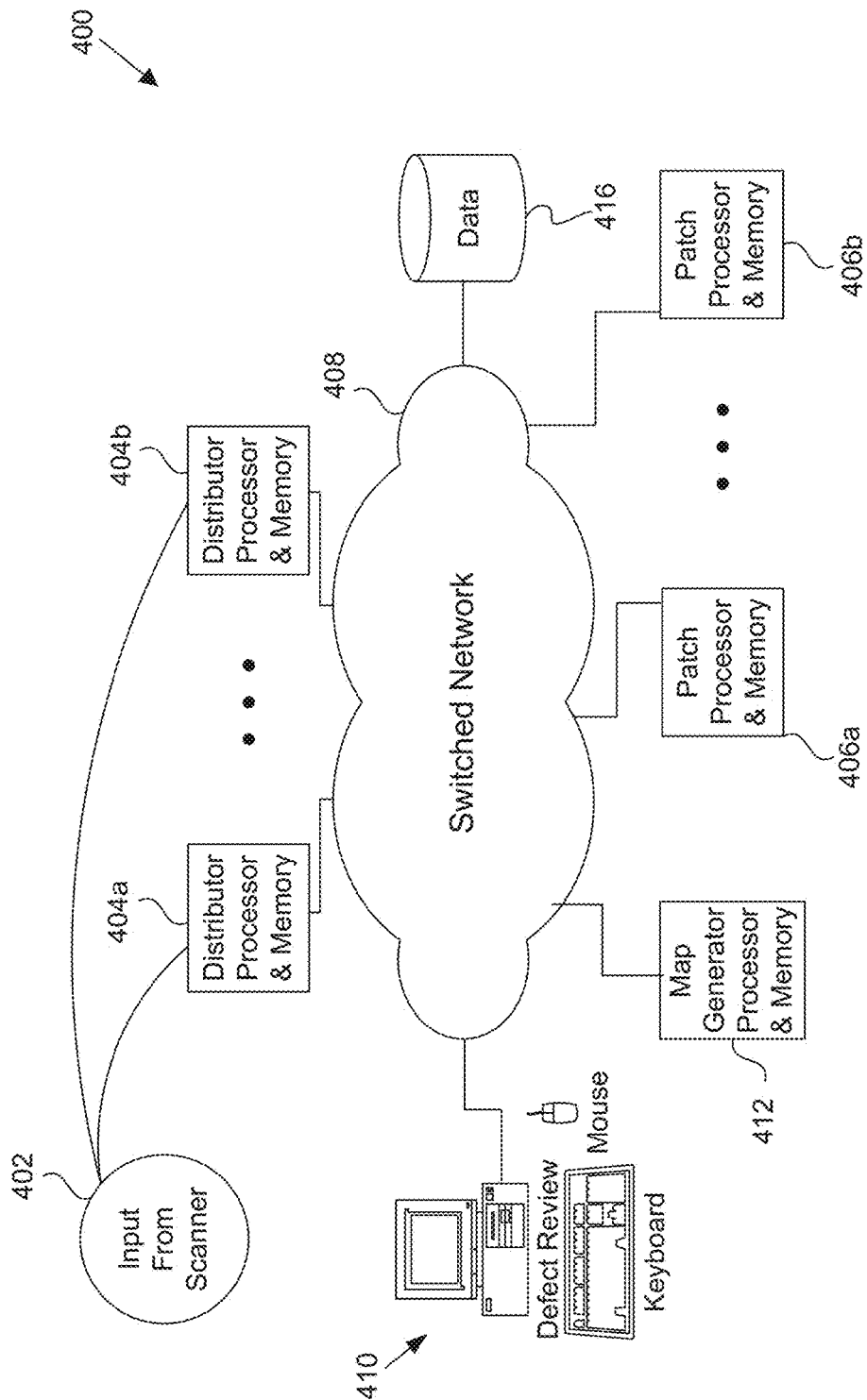
FIG. 4 is a diagrammatic representation of an example inspection system in which techniques of the present invention may be implemented

Techniques of the present invention may be implemented in any suitable combination of hardware and/or software. FIG. 4 is a diagrammatic representation of an example inspection system 400 in which techniques of the present invention may be implemented. The inspection system 400 may receive input 402 from an inspection tool or scanner (not shown). The inspection system 400 may also receive input 402 from a model that models images of the reticle based on the design database (or the system 400 may receive the design data base and then generate such modelled images). The inspection system may also include a data distribution system (e.g., 404a and 404b) for distributing the received input 402, an intensity signal (or patch) processing system (e.g., patch processors and memory 406a and 406b) for processing specific portions/patches of received input 402, a map generator system (e.g., Map Generator Processor and Memory 412) for generating ACD maps, a network (e.g., switched network 408) for allowing communication between the inspection system components, an optional mass storage device 416, and one or more inspection control and/or review stations (e.g., 410) for reviewing the maps. Each processor of the inspection system 400 typically may include one or more microprocessor integrated circuits and may also contain interface and/or memory integrated circuits and may additionally be coupled to one or more shared and/or global memory devices.

The scanner or data acquisition system (not shown) for generating input data 402 may take the form of any suitable instrument (e.g., as described further herein) for obtaining intensity signals or images of a reticle. For example, the scanner may construct an optical image or generate intensity values of a portion of the reticle based on a portion of detected light that is reflected, transmitted, or otherwise directed to one or more light sensors. The scanner may then output the intensity values or image may be output from the scanner.

The reticle is generally divided into a plurality of patch portions from which multiple intensity values from multiple points are obtained. The patch portions of the reticle can be scanned to obtain this intensity data. The patch portions may be any size and shape, depending on the particular system and application requirements. In general, multiple intensity values for each patch portion may be obtained by scanning the reticle in any suitable manner. By way of example, multiple intensity values for each patch portion may be obtained by raster scanning the reticle. Alternatively, the images may be obtained by scanning the reticle with any suitable pattern, such as a circular or spiral pattern. Of course, the sensors may have to be arranged differently (e.g., in a circular pattern) and/or the reticle may be moved differently (e.g., rotated) during scanning in order to scan a circular or spiral shape from the reticle.

In the example illustrated below, as the reticle moves past the sensors, light is detected from a rectangular region (herein referred to as a "swath") of the reticle and such detected light is converted into multiple intensity values at multiple points in each patch. In this embodiment, the sensors of the scanner are arranged in a rectangular pattern to receive light that is reflected and/or transmitted from the reticle and generate therefrom a set of intensity data that corresponds to a swath of patches of the reticle. In a specific example, each swath can be about 1 million pixels wide and about 1000 to 2000 pixels high, while each patch can be about 2000 pixels wide and 1000 pixels high.

Intensity values for each patch may be obtained using an optical inspection tool that is set up in any suitable manner. The optical tool is generally set up with a set of operating parameters or a "recipe" that is substantially the same for the different inspection runs for obtaining intensity values. Recipe settings may include one or more of the following settings: a setting for scanning the reticle in a particular pattern, pixel size, a setting for grouping adjacent signals from single signals, a focus setting, an illumination or detection aperture setting, an incident beam angle and wavelength setting, a detector setting, a setting for the amount of reflected or transmitted light, aerial modeling parameters, etc.

Intensity or image data 402 can be received by data distribution system via network 408. The data distribution system may be associated with one or more memory devices, such as RAM buffers, for holding at least a portion of the received data 402. Preferably, the total memory is large enough to hold an entire swath of data. For example, one gigabyte of memory works well for a swatch that is 1 million by 1000 pixels or points.

The data distribution system (e.g., 404a and 404b) may also control distribution of portions of the received input data 402 to the processors (e.g. 406a and 406b). For example, data distribution system may route data for a first patch to a first patch processor 406a, and may route data for a second patch to patch processor 406b. Multiple sets of data for multiple patches may also be routed to each patch processor.

The patch processors may receive intensity values or an image that corresponds to at least a portion or patch of the reticle. The patch processors may each also be coupled to or integrated with one or more memory devices (not shown), such as DRAM devices that provide local memory functions, such as holding the received data portion. Preferably, the memory is large enough to hold data that corresponds to a patch of the reticle. For example, eight megabytes of memory works well for intensity values or an image corresponding to a patch that is 512 by 1024 pixels. The patch processors may also share memory.

Each set of input data 402 may correspond to a swath of the reticle. One or more sets of data may be stored in memory of the data distribution system. This memory may be controlled by one or more processors within the data distribution system, and the memory may be divided into a plurality of partitions. For example, the data distribution system may receive data corresponding to a portion of a swath into a first memory partition (not shown), and the data distribution system may receive another data corresponding to another swath into a second memory partition (not shown). Preferably, each of the memory partitions of the data distribution system only holds the portions of the data that are to be routed to a processor associated with such memory partition. For example, the first memory partition of the data distribution system may hold and route first data to patch processor 406a, and the second memory partition may hold and route second data to patch processor 406b.

The detected signals may also take the form of aerial images. That is, an aerial imaging technique may be used to simulate the optical effects of the photolithography system so as to produce an aerial image of the photoresist pattern that is exposed on the wafer. In general, the optics of the photolithography tool are emulated so as to produce an aerial image based on the detected signals from the reticle. The aerial image corresponds to the pattern produced from the light passed through the photolithography optics and reticle onto the photoresist layer of a wafer. Additionally, the photoresist exposure process for the particular type of photoresist material may also be emulated.

The incident light or detected light may be passed through any suitable spatial aperture to produce any incident or detected light profile at any suitable incident angles. By way of examples, programmable illumination or detection apertures may be utilized to produce a particular beam profile, such as dipole, quadrapole, quasar, annulus, etc. In a specific example, Source Mask Optimization (SMO) or any pixelated illumination technique may be implemented.

The data distribution system may define and distribute each set of data of the data based on any suitable parameters of the data. For example, the data may be defined and distributed based on the corresponding position of the patch on the reticle. In one embodiment, each swath is associated with a range of column positions that correspond to horizontal positions of pixels within the swath. For example, columns 0 through 256 of the swath may correspond to a first patch, and the pixels within these columns will comprise the first image or set of intensity values, which is routed to one or more patch processors. Likewise, columns 257 through 512 of the swath may correspond to a second patch, and the pixels in these columns will comprise the second image or set of intensity values, which is routed to different patch processor(s).

Figure 5A:
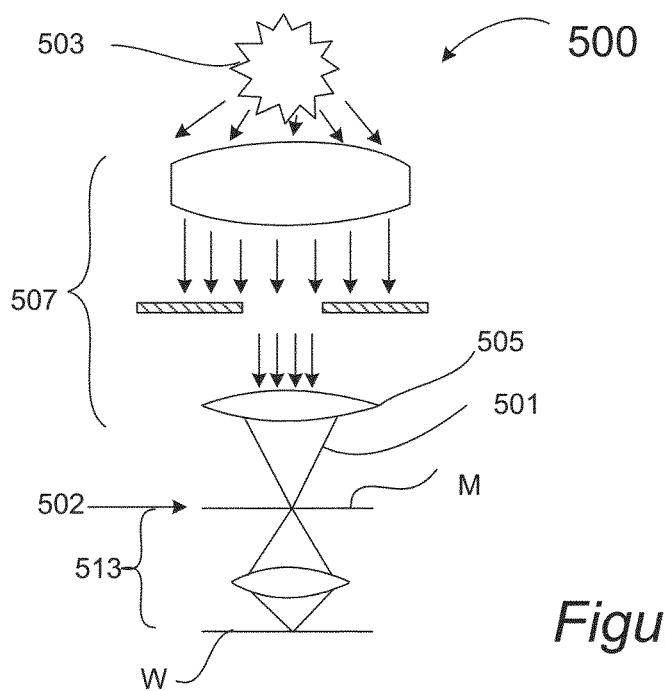
FIG. 5A is a simplified schematic representation of a lithographic system for transferring a mask pattern from a photomask onto a wafer in accordance with certain embodiments.

FIG. 5A is a simplified schematic representation of a typical lithographic system 500 that can be used to transfer a mask pattern from a photomask M onto a wafer W in accordance with certain embodiments. Examples of such systems include scanners and steppers, more specifically TWINSCAN system available from ASML in Veldhoven, Netherlands. In general, an illumination source 503 directs a light beam through an illumination optics 507 (e.g., lens 505) onto a photomask M located in a mask plane 502. The illumination lens 505 has a numeric aperture 501 at that plane 502. The value of the numerical aperture 501 impacts which defects on the photomask are lithographic significant defects and which ones are not. A portion of the beam that passes through the photomask M forms a patterned optical signal that is directed through imaging optics 513 and onto a wafer W to initiate the pattern transfer.

Figure 5B:
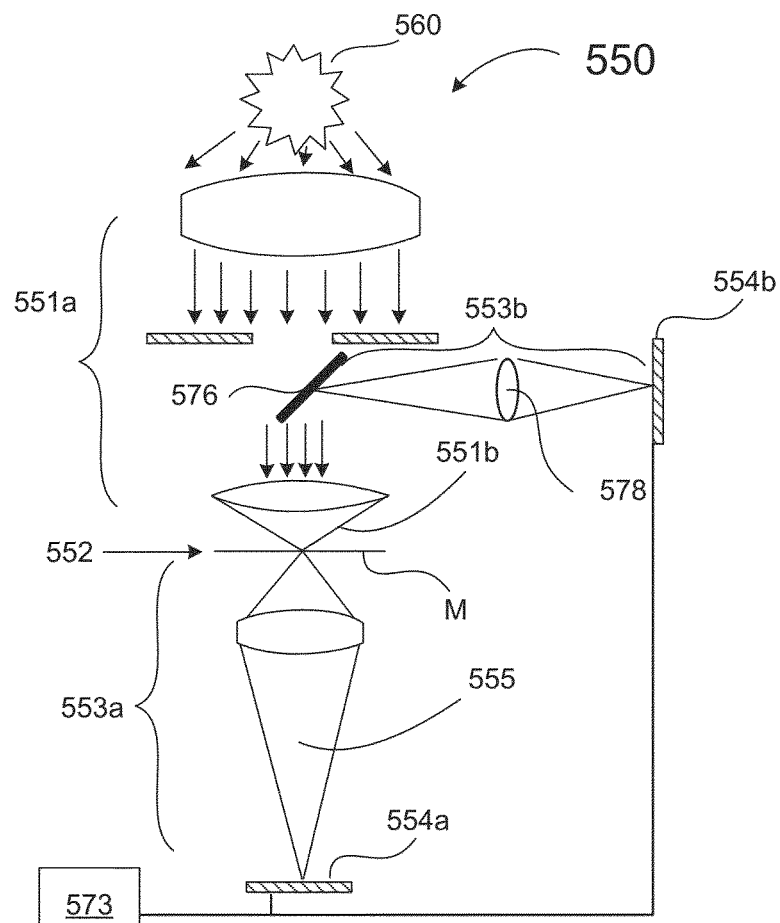
FIG. 5B provides a schematic representation of a photomask inspection apparatus in accordance with certain embodiments.

FIG. 5B provides a schematic representation of an example inspection system 550 that has illumination optics 551a includes an imaging lens with a relative large numerical aperture 551b at a reticle plane 552 in accordance with certain embodiments. The depicted inspection system 550 includes detection optics 553a and 553b, including microscopic magnification optics designed to provide, for example, 60-300× magnification or more for enhanced inspection. For example, the numerical aperture 551b at the reticle plane 552 of the inspection system may be considerable greater than the numerical aperture 501 at the reticle plane 502 of the lithography system 500, which would result in differences between test inspection images and actual printed images.

The inspection techniques described herein may be implemented on various specially configured inspection systems, such as the one schematically illustrated in FIG. 5B. The illustrated system 550 includes an illumination source 560 producing a light beam that is directed through illumination optics 551a onto a photomask M in the reticle plane 552. Examples of light sources include lasers or filtered lamps. In one example, the source is a 193 nm laser. As explained above, the inspection system 550 may have a numerical aperture 551b at the reticle plane 552 that may be greater than a reticle plane numerical aperture (e.g., element 501 in FIG. 5A) of the corresponding lithography system. The photomask M to be inspected is placed on a mask stage at the reticle plane 552 and exposed to the source.

The patterned image from the mask M is directed through a collection of optical elements 553a, which project the patterned image onto a sensor 554a. In a reflecting system, optical elements (e.g., beam splitter 576 and detection lens 578) direct and capture the reflected light onto sensor 554b. Suitable sensors include charged coupled devices (CCD), CCD arrays, time delay integration (TDI) sensors, TDI sensor arrays, photomultiplier tubes (PMT), and other sensors.

The illumination optics column may be moved respect to the mask stage and/or the stage moved relative to a detector or camera by any suitable mechanism so as to scan patches of the reticle. For example, a motor mechanism may be utilized to move the stage. The motor mechanism may be formed from a screw drive and stepper motor, linear drive with feedback position, or band actuator and stepper motor, by way of examples.

The signals captured by each sensor (e.g., 554a and/or 554b) can be processed by a computer system 573 or, more generally, by one or more signal processing devices, which may each include an analog-to-digital converter configured to convert analog signals from each sensor into digital signals for processing. The computer system 573 typically has one or more processors coupled to input/output ports, and one or more memories via appropriate buses or other communication mechanisms.

The computer system 573 may also include one or more input devices (e.g., a keyboard, mouse, joystick) for providing user input, such as changing focus and other inspection recipe parameters. The computer system 573 may also be connected to the stage for controlling, for example, a sample position (e.g., focusing and scanning) and connected to other inspection system components for controlling other inspection parameters and configurations of such inspection system components.

The computer system 573 may be configured (e.g., with programming instructions) to provide a user interface (e.g., a computer screen) for displaying resultant intensity values, images, and other inspection results. The computer system 573 may be configured to analyze intensity changes, phase, and/or other characteristics of reflected and/or transmitted sensed light beam. The computer system 573 may be configured (e.g., with programming instructions) to provide a user interface (e.g., on a computer screen) for displaying resultant intensity values, images, and other inspection characteristics. In certain embodiments, the computer system 573 is configured to carry out inspection techniques detailed above Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

In certain embodiments, a system for inspecting a photomask includes at least one memory and at least one processor that are configured to perform techniques described herein. One example of an inspection system includes a specially configured TeraScan™ DUV inspection system available from KLA-Tencor of Milpitas, Calif.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method of inspecting a photolithographic reticle, the method comprising:
   obtaining modeled images of a plurality of target features of the reticle based on a design database for fabricating the reticle;
   from an inspection tool, obtaining a plurality of actual images of the target features of the reticle;
   binning the modelled images and the actual images into a plurality of bins based on image properties of the modelled and actual images, wherein at least some of the image properties of each bin are affected by one or more neighbor features of the target features on the reticle in a same manner; and
   analyzing the modelled images and the actual images from at least one of the bins to generate a feature characteristic uniformity map for the reticle,
   wherein the feature characteristic uniformity map for each bin is a critical dimension uniformity (CDU) map for each bin,
   wherein each modelled image includes a target feature having a CD value and a surrounding area, and wherein each modelled image incorporates at least a portion of the optical properties of the inspection tool.

2. The method of claim 1, wherein each bin contains modeled images that contain a near-constant CD error for the CD values of the features of such bin, and the CD error variation of each bin is less than 30% of accuracy requirement on CDU measurement.

3. The method of claim 1, wherein each modelled and actual image may have a size that includes the corresponding feature image and an image area that is within a distance that is 10 times the point-spread-function of the inspection tool from such corresponding feature image.

4. The method of claim 1, wherein the image properties include one or more of the following characteristics: slope, shape, size, brightness, color, texture, moment of inertia, context, proximity or adjacency to other features, transparency/opaqueness, or resulting values from performing a Fourier transform or other image analysis technique on each image.

5. The method of claim 4, wherein the binning is accomplished by first sorting the modelled and actual images into a plurality of first bins based on one or more of the image properties that are not affected by one or more neighbor features of the target features and then sorting the modelled and actual images of each first bin into a plurality of second bins based on one or more of the image properties that are affected by one or more neighbor features of the target features.

6. The method of claim 1, wherein the binning includes using a principal component analysis (PCA) to determine which image properties to use in the binning.

7. The method of claim 6, wherein the binning includes weighting the images properties based on their relative optical effect.

8. The method of claim 6, wherein the binning includes using a locality-sensitive hashing process.

9. The method of claim 6, wherein the binning includes using a partitioning or agglomeration type clustering process.

10. The method of claim 1, further comprising:
    analyzing the modelled images and the actual images from each of the bins to generate a feature characteristic uniformity map for each bin;
    analyzing at least a portion of the feature characteristic uniformity maps to determine whether the reticle is within specification;
    repairing or discarding the reticle if the reticle is determined to not be within specification; and
    using the reticle if it is determined to be within specification.

11. The method of claim 10, further comprising determining a root cause based on a particular one of the feature characteristic uniformity maps being out of specification and associated with a predefined signature.

12. An inspection system for inspecting a photolithographic reticle, the system comprising:
    illumination optics for generating and directing an incident beam towards the reticle;
    output optics for detecting actual images from the reticle in response to the incident beam; and
    at least one memory and at least one processor that are configured to initiate the following operations:
        obtaining modeled images of a plurality of target features of the reticle based on a design database for fabricating the reticle;
        using the inspection system to obtain a plurality of actual images of the target features of the reticle;
        binning the modelled images and the actual images into a plurality of bins based on image properties of the modelled and actual images, wherein at least some of the image properties of each bin are affected by one or more neighbor features of the target features on the reticle in a same manner; and
        analyzing the modelled images and the actual images from at least one of the bins to generate a feature characteristic uniformity map for the reticle,
    wherein the feature characteristic uniformity map for each bin is a critical dimension uniformity (CDU) map for each bin, wherein each modelled image includes a target feature having a CD value and a surrounding area, and wherein each modelled image incorporates at least a portion of the optical properties of the inspection tool.

13. The system of claim 12, wherein each bin contains modeled images that contain a near-constant CD error for the CD values of the features of such bin, and the CD error variation of each bin is less than 30% of accuracy requirement on CDU measurement.

14. The system of claim 12, wherein each modelled and actual image may have a size that includes the corresponding feature image and an image area that is within a distance that is 10 times the point-spread-function of the inspection tool from such corresponding feature image.

15. The system of claim 12, wherein the image properties include one or more of the following characteristics: slope, shape, size, brightness, color, texture, moment of inertia, context, proximity or adjacency to other features, transparency/opaqueness, or resulting values from performing a Fourier transform or other image analysis technique on each image.

16. The system of claim 15, wherein the binning is accomplished by first sorting the modelled and actual images into a plurality of first bins based on one or more of the image properties that are not affected by one or more neighbor features of the target features and then sorting the modelled and actual images of each first bin into a plurality of second bins based on one or more of the image properties that are affected by one or more neighbor features of the target features.

17. The system of claim 12, wherein the binning includes using a principal component analysis (PCA) to determine which image properties to use in the binning.

18. The system of claim 17, wherein the binning includes weighting the images properties based on their relative optical effect.

19. The system of claim 17, wherein the binning includes using a locality-sensitive hashing process.

20. The system of claim 17, wherein the binning includes using a partitioning or agglomeration type clustering process.

21. The system of claim 12, wherein the at least one memory and at least one processor are further configured for:
  analyzing the modelled images and the actual images from each of the bins to generate a feature characteristic uniformity map for each bin;
  analyzing at least a portion of the feature characteristic uniformity maps to determine whether the reticle is within specification;
  repairing or discarding the reticle if the reticle is determined to not be within specification; and
  using the reticle if it is determined to be within specification.

22. The system of claim 21, further comprising determining a root cause based on a particular one of the feature characteristic uniformity maps being out of specification and associated with a predefined signature.

23. A computer readable medium having instruction stored thereon for performing the following operations:
  obtaining modeled images of a plurality of target features of the reticle based on a design database for fabricating the reticle;
  from an inspection tool, obtaining a plurality of actual images of the target features of the reticle;
  binning the modelled images and the actual images into a plurality of bins based on image properties of the modelled and actual images, wherein at least some of the image properties of each bin are affected by one or more neighbor features of the target features on the reticle in a same manner; and
  analyzing the modelled images and the actual images from at least one of the bins to generate a feature characteristic uniformity map for the reticle,
  wherein the feature characteristic uniformity map for each bin is a critical dimension uniformity (CDU) map for each bin,
  wherein each modelled image includes a target feature having a CD value and a surrounding area, and wherein each modelled image incorporates at least a portion of the optical properties of the inspection tool.

* * * * *